(12) United States Patent
Asano (10) Patent No.: US 8,288,972 B2
(45) Date of Patent: Oct. 16, 2012

(54) STAGE DEVICE, METHOD FOR CONTROLLING STAGE DEVICE, EXPOSURE APPARATUS USING SAME, AND DEVICE MANUFACTURING METHOD

(75) Inventor: Tosiya Asano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 363 days.

(21) Appl. No.: 12/770,594

(22) Filed: Apr. 29, 2010

(65) Prior Publication Data

US 2010/0310994 A1  Dec. 9, 2010

(30) Foreign Application Priority Data

Jun. 9, 2009 (JP) ................................. 2009-138699

(51) Int. Cl.
*H02K 41/02* (2006.01)

(52) U.S. Cl. ........ 318/135; 318/115; 318/633; 318/610; 318/623; 318/632; 310/12.01; 310/12.05; 310/12.06

(58) Field of Classification Search .................. 318/135, 318/115, 633, 610, 623, 632; 310/12.01, 310/12.05, 12.06
See application file for complete search history.

(56) References Cited

U.S. PATENT DOCUMENTS

| | | | | |
|---|---|---|---|---|
| 5,780,943 A * | 7/1998 | Ono | ............................ | 310/12.06 |
| 5,815,246 A * | 9/1998 | Sperling et al. | .................. | 355/53 |
| 6,271,640 B1 * | 8/2001 | Lee | ............................... | 318/560 |
| 6,281,654 B1 * | 8/2001 | Lee | ............................... | 318/649 |
| 7,061,577 B2 * | 6/2006 | Yuan et al. | ...................... | 355/53 |
| 2008/0236997 A1 * | 10/2008 | Ebihara | .......................... | 198/618 |

FOREIGN PATENT DOCUMENTS

JP  2006-136154 A  5/2006

* cited by examiner

*Primary Examiner* — Rita Leykin (74) *Attorney, Agent, or Firm* — Canon USA, Inc., IP Division (57) ABSTRACT

The stage device of the present invention includes a linear motor having a coil and a plurality of permanent magnets, a current driver that supplies current to the coil, and a control section that generates a command for the current driver. The control section generates the command through commutation processing in which a sinusoidal wave using an electrical angle obtained by calculation based on the relative position between the coil and the permanent magnet is multiplied by a thrust force command value for the linear motor, and further ensures that a sinusoidal wave component, which has an amplitude proportional to a thrust force command value and is 90 degrees out of phase from the sinusoidal wave, is included in the command.

12 Claims, 5 Drawing Sheets

STAGE DEVICE, METHOD FOR CONTROLLING STAGE DEVICE, EXPOSURE APPARATUS USING SAME, AND DEVICE MANUFACTURING METHOD

BACKGROUND OF THE INVENTION

1. Field of the Invention

The present invention relates to a stage device, a method for controlling a stage device, an exposure apparatus using the same, and a device manufacturing method.

2. Description of the Related Art

An exposure apparatus is an apparatus that transfers a pattern of an original (reticle) onto a photosensitive substrate (e.g., wafer, glass plate, and the like, where the surface thereof is coated with a resist layer) via a projection optical system in a lithography process in a manufacturing process of a semiconductor element, a liquid crystal display element, and the like. For example, by mounting a wafer on a positioning stage device with the wafer being adhered using suction by a chuck and giving the positioning stage device a scanning movement, the exposure apparatus appropriately changes the position of a wafer to be exposed and repeats projection exposure. Likewise, the positioning stage device is also used when a reticle is mounted for scanning movement.

In recent years, a positioning stage device requires highly accurate positioning and high speed movement. In order to meet such requirements, Japanese Patent Laid-Open No. 2006-136154 discloses a positioning apparatus that employs a linear motor for producing a force between a coil and a permanent magnet. The linear motor controls the current flowing through the coil, where a command current value for a current driver is calculated based on an electrical angle depending on the relative position between the coil and the magnet (i.e., a so-called "commutation processing"), and controls current flowing through the coil. For example, when the positioning apparatus is driven in the horizontal direction by a two-phase linear motor having a phase A and a phase B, a command current value, which is proportional to cos θ in phase A and −sin θ in phase B, is provided to the current driver using the electrical angle θ set by the relative position between the coil and the magnet. When the positioning apparatus is driven in the vertical direction by the linear motor, a command current value, which is proportional to sin θ in phase A and cos θ in phase B, is provided to the current driver.

Here, the aforementioned current driver detects the current flowing through the coil to perform feedback control. However, although it is an ideal that a transfer function from the command current value subjected to commutation processing to the current flowing through the coil is constant regardless of frequency, in practice, the transfer function has frequency characteristics caused by the inductance of the coil, the influence of filter provided in the current driver circuit, and the like. Due to the frequency characteristics, the higher-frequency command current value subjected to commutation processing leads to more delay of the current flowing through the coil. Hence, in the conventional linear motor, a force acting in a direction different from the direction to be driven occurs due to the error current caused by the delay of the current flowing through the coil. Since such force may cause degradation of control characteristics for the linear motor, it is desirable that such a force be excluded as much as possible in order to provide a highly-accurate positioning.

SUMMARY OF THE INVENTION

In view of the foregoing, the present invention provides a stage device employing a linear motor that reduces a force acting in a direction different from the direction to be driven, which occurs due to a delay of the current flowing through the coil, and a method for controlling the stage device.

According to an aspect of the present invention, a stage device is provided that includes a linear motor having a coil and a plurality of permanent magnets, a current driver that supplies current to the coil, and a control section that generates a command for the current driver, wherein the control section generates a command through commutation processing in which a sinusoidal wave using an electrical angle obtained by calculation based on the relative position between the coil and the permanent magnet is multiplied by a thrust force command value for the linear motor, and further ensures that a sinusoidal wave component, which has an amplitude proportional to a thrust force command value and is 90 degrees out of phase with the sinusoidal wave, is included in the command. According to another aspect of the present invention, a stage device is provided that includes a linear motor having a coil and a plurality of permanent magnets, a current driver that supplies current to the coil, and a control section that generates a command for the current driver, wherein the control section generates the command by multiplying a sinusoidal wave using an electrical angle, which is obtained by adding a first electrical angle obtained based on a relative position between the coil and the permanent magnet and a second electrical angle obtained based on the derivative value with respect to the time for the first electrical angle, by a thrust force command value for the linear motor.

According to the present invention, a command (current value) includes a sinusoidal wave component, which has an amplitude proportional to a thrust force command value and is 90 degrees out of phase with the sinusoidal wave, whereby the force acting in a direction different from the direction to be driven, which occurs due to the delay of the current flowing through the coil, can be reduced.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the attached drawings.

First Embodiment

Figure 1A:
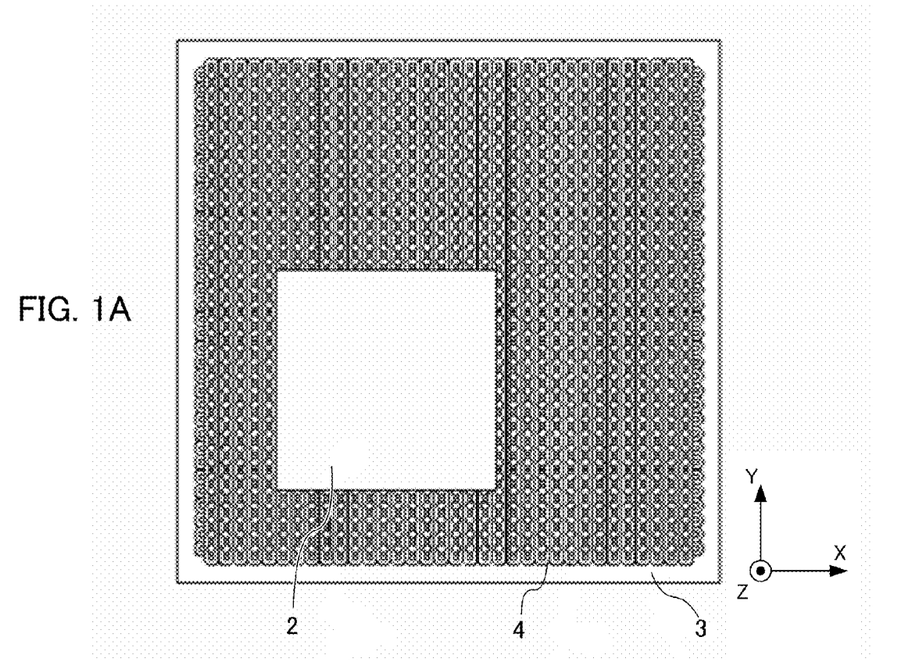
FIG. 1A is a plan view illustrating the configuration of the planar linear motor type stage device of the present invention.
Figure 1B:
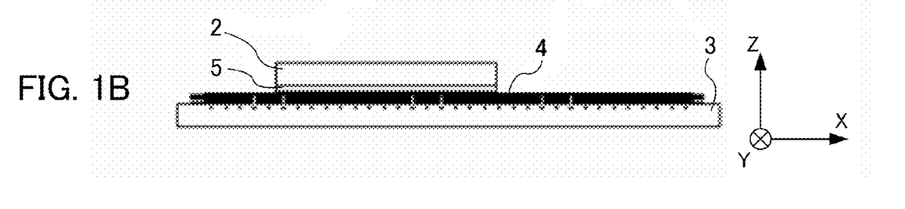
FIG. 1B is a side view illustrating the configuration of the planar linear motor type stage device of the present invention.

FIG. 1A is a schematic plan view illustrating a planar linear motor type stage device (hereinafter referred to simply as "stage device") according to a first embodiment of the present invention. FIG. 1B is a schematic side view illustrating the stage device. A description will be given for the case where the stage device is applied to a wafer stage (substrate stage) for a semiconductor exposure apparatus. For the purpose of explanation, throughout the following drawings, the Z axis is aligned vertically right above the surface along the scanning direction of the stage device, the Y axis is aligned in the scanning direction of a wafer during scanning exposure in the plane perpendicular to the Z axis, and the X axis is aligned in the non-scanning direction perpendicular to the Y axis.

A stage device 1 includes a stage 2 and a base member 3 that is a standard base of the stage 2. The stage 2 is a moving body that is movable in the X and Y directions while placing and holding the wafer, i.e., the substrate to be treated. A movable magnet group 5 consisting of a plurality of permanent magnets is provided on the back surface of the stage 2 such that the movable magnet group 5 faces a coil group 4 provided on the base member 3. The movable magnet group 5 is composed of a main pole magnet and a sub pole magnet. The main pole magnet being magnetized in the Z direction is alternatively arranged while changing the magnetic pole direction with a specified cycle. On the other hand, the sub pole magnet, which is being magnetized in the horizontal direction (the X and Y directions), provided between the main pole magnets is appropriately arranged in a two-dimensional Halbach array. Note that a member comprised of the base member 3 and the coil group 4 is hereinafter referred to as "stator unit".

The stage device 1 constitutes a planar linear motor together with the coil group 4 and the movable magnet group 5, and provides thrust forces in the horizontal direction (XY) and vertical direction (Z). Hereinafter, the six axes composed of the X, Y, and Z axes and the θx, θy, and θz axes, which have a rotational direction around the respective X, Y, and Z axes, are referred to as "control axis". Here, in the stage device 1 of the present invention, a magnet for the θ-axis (not shown), which is offset from the center of the stage device 1 and extends asymmetrically, is installed in the movable magnet group 5, whereby the moment along the θz axis can be generated. Furthermore, the stage device 1 can generate moment along the θy and θx axes by balancing the Z-directional control force. In other words, the planar linear motor applied to the stage device 1 can provide a thrust force for all control axes.

Figure 2:
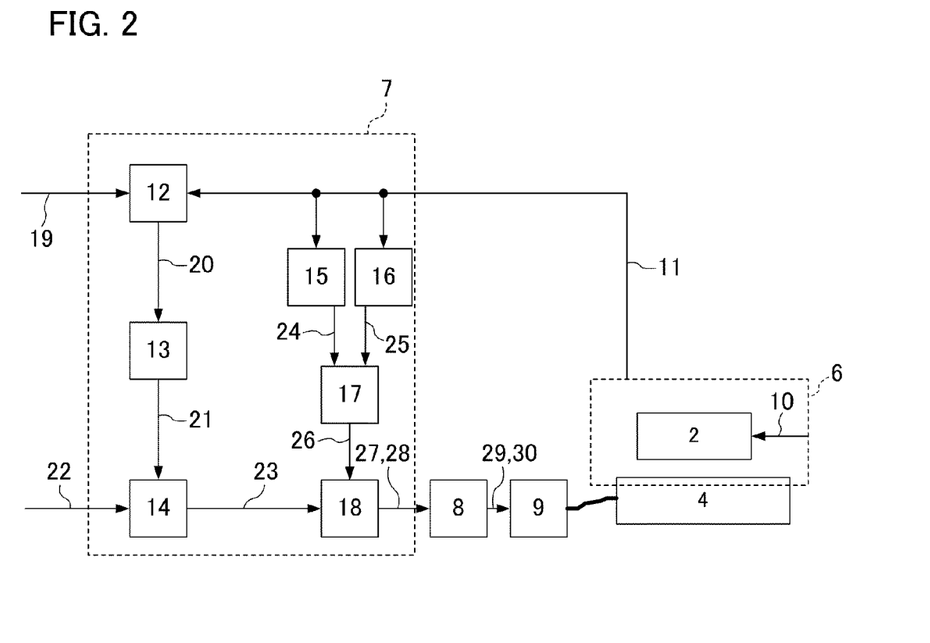
FIG. 2 is a block diagram illustrating a linear motor control system according to a first embodiment of the present invention.

FIG. 2 is a block diagram illustrating a linear motor control system according to a first embodiment of the present invention. In FIG. 2, the same elements as those shown in FIG. 1A are designated by the same reference numerals and explanation thereof will be omitted. FIG. 2 is a diagram relating only to the Y control axis, and the same control system as the control system for the Y axis shown in FIG. 2 is provided for all the other five control axes, respectively. With these control systems, the stage 2 is positioning-controlled at a desired position. The linear motor control system is constituted by a laser interferometer system 6 for measuring the position in the Y direction of the stage 2, a control apparatus 7, a DA converter 8, and a current driver 9 for supplying current to the coil group 4.

The laser interferometer system 6 includes a laser oscillator, a light deflection mirror, an interferometer, an interfering light receiver, an optical fiber, and a processing system electric substrate, none of which are illustrated. A measuring light 10 output from the interferometer is reflected by a reflecting mirror (not shown) provided on the stage 2 to return again to the interferometer. The laser interferometer system 6 outputs a position measurement value (y) 11, which is an electrical signal corresponding to the Y-directional position of the stage 2, to the control apparatus 7. Note that the laser interferometer system 6 has at least six measuring lights 10, and measures the stage displacement corresponding to the control axes.

The control apparatus 7 is a control section to which the control system for a linear motor to be described below is applied. The control apparatus 7 includes a deviation calculator 12, a feedback controller 13, a command calculator 14, a first electrical angle calculator 15, a second electrical angle calculator 16, an electrical angle adder 17 as a third electrical angle calculator, and a commutation calculator 18. Here, the control apparatus 7 is configured by a digital computer consisting of a computer, a sequencer, or the like. All signals in the control apparatus 7 are digital values. Note that the processing system electric substrate for the aforementioned laser interferometer system 6 is also configured by a digital computer, and the position measurement value (y) 11 that is an output value thereof is likewise a digital value.

The deviation calculator 12 is a section that calculates a deviation (e) 20, i.e., a difference value between a Y-directional stage position command (d) 19 and the position measurement value (y) 11. The feedback controller 13 is a section that outputs a feedback control command (fb) 21 to make the deviation (e) 20 zero. Here, while the PID control is used as a control theory, other control theory may also be used. The command calculator 14 is a section that adds a feedback control signal (fb) 21 to a feed forward control command (ff) 22 and multiplies the gain by the added value so as to calculate a command value (Iy) 23 for the linear motor. A detailed description of the first electrical angle calculator 15, a first electrical angle ($\phi$) 24, the second electrical angle calculator 16, a second electrical angle ($\psi$) 25, the electrical angle adder 17, an electrical angle ($\theta$) 26, the commutation calculator 18, a command current value (Ya) 27, and a command current value (Yb) 28 will be given below.

The instructions by the command current value (Ya) 27 and the command current value (Yb) 28, which are digital values, are converted into a command current value (AYa) 29 and a command current value (AYb) 30, which are analog values, by the DA converter 8, and input to the current driver 9. The current driver 9 supplies the current with the command (current value) being set as the target value to the coil belonging to the coil group 4 connected therewith.

Next, commutation processing that is applied to the control system for the linear motor of the present invention will be described. The Y-directional forces FYa and FYb, which are generated when a unit current flows to a phase A coil and a phase B coil, respectively, change sinusoidally with respect to the relative displacement between the coil and the magnet. With this configuration, the coil position is assumed to be immobile, the relative displacement between the coil and the magnet is the same as the stage displacement. Hence, when the Y-directional stage position measurement value (y) 11 is used, FYa and FYb are respectively represented by the following formulae:

$$FYa = Ky \times \cos(2\pi/T \times y) \quad (1)$$

$$FYb = -Ky \times \sin(2\pi/T \times y) \quad (2)$$

where Ky represents a thrust force constant (N/A), and T represents a cycle (T=4/3P, P: coil pitch (the center to center distance between the phase A coil and the phase B coil)). In other words, the force that arises in phase A and phase B changes sinusoidally corresponding to the stage displacement. Hereinafter, the term "$2\pi/T \times y$" is referred to as "electrical angle".

Next, the first electrical angle calculator 15 executes computation using the following formula in order to calculate the first electrical angle ($\phi$) 24.

$$\phi = 2\pi/T \times y \quad (3)$$

First, instead of using the control method of the present invention, a description will be made using the conventional control method. In other words, the commutation calculator 18 executes computation using the following formulae using the electrical angle $\theta=\phi$, with respect to the command value (Iy) 23.

$$Ya = Iy \times \cos\theta \quad (4)$$

$$Yb = -Iy \times \sin\theta \quad (5)$$

It is assumed that the command current value is analogized by the DA converter 8, but the property of the command itself remains unchanged. Hereinafter, AYa=Ya and AYb=Yb. Also, it is assumed that the low-frequency gain (the gain at a frequency 0) for the current driver 9 is 1.0, the error current is not generated in the current driver 9, and the current equal to the command current value flows through the coil.

At this time, the thrust forces fa and fb in the Y direction, which are generated in phase A and phase B, are represented by the following formulae by multiplying the formulae (1) and (2) by the command current values in formulae (4) and (5), respectively. Note that $\theta$ represents ($2\pi/T \times y$).

$$fa = Ky \times Iy \times \cos^2\theta \quad (6)$$

$$fb = Ky \times Iy \times \sin^2\theta \quad (7)$$

Here, the resultant force of the thrust forces, fy=fa+fb, is represented by the following formula from the relationship $\cos^2\theta + \sin^2\theta = 1$.

$$fy = Ky \times Iy \quad (8)$$

As shown in the formula (8), the electrical angle $\theta$ is absent in the formula of fy. In other words, the thrust force fy is proportional to the command value Iy regardless of the stage position measurement value (y) 11. In this way, for the linear motor in which the thrust force changes depending on the relative displacement between the coil and the magnet, the multiplication of the sinusoidal wave represented by the electrical angle, which has been calculated based on the relative position between the coil and the permanent magnet, and the thrust force command value for the linear motor is referred to as "commutation processing".

Next, the command calculator 14 executes computation for calculating the command value Iy. In this case, when the command value Iy is calculated from the feedback control command (fb) 21 and the feed forward control command (ff) 22, where each of which is the dimension of force, the sum of fb and ff is divided by the thrust force constant K.

$$Iy = (fb+ff)/Ky \quad (9)$$

Here, the actual current flowing through the coil may not necessarily be as instructed, and hence an error current is generated due to the characteristics of the current driver 9. Hereinafter, instead of using the control method of the present invention, a description will also be made regarding the influence due to an error current using the conventional technique. The derivative value for the command current times the gain of $-\alpha$ ($\alpha>0$) can be approximated as the error current. Hence, with respect to the command currents in formulae (4) and (5), the actually flowing currents Yae and Ybe are represented by the following formulae, respectively:

$$\begin{aligned} Yae &= Iy \times \cos\theta - \alpha(Iy \times \cos\theta)' \\ &= Iy \times \cos\theta - \alpha Iy'\cos\theta + \alpha Iy \times \omega\sin\theta \end{aligned} \quad (10)$$

$$\begin{aligned} Ybe &= -Iy \times \sin\theta + \alpha(Iy \times \sin\theta)' \\ &= -Iy \times \sin\theta + \alpha Iy'\sin\theta + \alpha Iy \times \omega\cos\theta \end{aligned} \quad (11)$$

where $\omega = d\theta/dt$.

The Y-directional thrust force fy is given by the relationship: FYa×Yae+FYb×Ybe, and is represented by the following formula:

$$fy = Ky \times Iy - \alpha Ky \times Iy' \quad (12)$$

As shown in the formula (12), the error force proportional to Iy', which is the derivative of the command value Iy, is generated in the thrust force fy. The error force can be handled using a known feed forward technique in which a correction factor proportional to the derivative value is added to the feed forward control command (ff) 22.

Here, a feed forward correction command calculator (not shown) executes computation for calculating a correction factor generated by multiplying the derivative value of the feed forward control command (ff) 22 by the coefficient $\alpha$. Note that the main component of Iy in the formula (9) is the feed forward control command (ff) 22 during stage acceleration and deceleration, and the feedback control signal (fb) 21 is just a feed forward error, which is a small amount. When feed forward correction is used in consideration of such factors, formula (9)' is derived from the formula (9).

$$(fb+ff+\alpha ff')/Ky = Iy+\alpha Iy' \quad (9)'$$

With this feed forward correction, fy in the formula (12) is represented by the following formula.

$$fy = Ky \times Iy \quad (12)'$$

In this way, the thrust force fy becomes a desired value which is proportional to the command value Iy. Calculation of the coefficient $\alpha$ will be described below.

Next, a description will now be given of another component force which is generated in the Z direction due to the actually flowing currents Yae and Ybe. The Z-directional forces Fza and Fzb, which are generated when a unit current flows to phase A and phase B, are represented by the following formulae:

$$Fza = Kz \times \sin(2\pi/T \times y) \quad (13)$$

$$Fzb = Kz \times \cos(2\pi/T \times y) \quad (14)$$

In other words, the formulae (13) and (14) are 90 degrees out of phase with the formulae (1) and (2), respectively. Here, from the formulae (11), (12), (13), and (14), the other Z-directional component force fzy from the Y-directional command value Iy is given by the relationship: Fza×Yae+Fzb× Ybe, and is represented by the following formula:

$$fzy = \alpha\omega \times Kz \times Iy \qquad (15)$$

In this way, a force proportional to the Y-directional command value Iy is generated in the Z direction. This force is proportional to ω, and is also proportional to the time variation of θ, i.e., the time derivative of the stage position. Ideally, there should be no other Z-directional component force generated from the command current in the Y direction. The stage positioning characteristics are degraded due to other component force.

Here, when the formula (9)' derived from the feed forward correction is used, the formula (15) is represented by the following formula:

$$fzy = \alpha\omega KzIy + \alpha^2 \omega KzIy' \qquad (15)'$$

Since the coefficient α is very small, and $\alpha^2$ is multiplied by the second term of the formula (15)', the second term is substantially negligible. Hence, hereinafter, the formula (15) is employed. Note that the same principle is also applied to the Z direction.

Next, the commutation calculator 18 executes computation on the command value Iz in the Z direction using the following formulae:

$$Za = Iz \times \sin\theta \qquad (16)$$

$$Zb = Iz \times \cos\theta \qquad (17)$$

At this time, if it is assumed that no error current is generated in the current flowing through the coil, the Z directional thrust force fz is given by the relationship: Fza×Za+Fzb×Zb using the formulae (13), (14), (16), and (17), and hence is represented by the following formula:

$$fz = Kz \times Iz \qquad (18)$$

Also, if an error current is generated due to the characteristics of the current driver 9, the currents flowing through the coil, i.e., Zae and Zbe are represented by the following formulae, respectively:

$$\begin{aligned} Zae &= Iz \times \sin\theta - \alpha(Iz \times \sin\theta)' \\ &= Iz \times \sin\theta - \alpha Iz' \sin\theta - \alpha Iz \times \omega\cos\theta \end{aligned} \qquad (19)$$

$$\begin{aligned} Zbe &= Iz \times \cos\theta - \alpha(Iz \times \cos\theta)' \\ &= Iz \times \cos\theta - \alpha Iz' \cos\theta + \alpha Iz \times \omega\sin\theta \end{aligned} \qquad (20)$$

Furthermore, the Z directional thrust force fz is given by the relationship: Fza×Zae+Fzb×Zbe using the formulae (13), (14), (19), and (20), and is represented by the following formula:

$$fz = Kz \times Iz - \alpha Kz \times Iz' \qquad (21)$$

As shown in the formula (21), an error force, which is proportional to the derivative Iz' of the command value Iz, occurs in the Z directional thrust force fz. Here, the main component of the Z directional thrust force fz is a force for supporting the stage's own weight. Hence, since the fluctuation amount of the command value Iz is small, the effect of Iz' is substantially negligible, whereby the Z directional thrust force fz is represented by the following formula:

$$fz = Kz \times Iz \qquad (21)'$$

Also, the other Y-directional component force fyz obtained from the Z-directional command value Iz is given by the relationship: FYa×Zae+FYb×Zbe using the formulae (1), (2), (19), and (20), and is represented by the following formula:

$$fyz = -\alpha\omega \times Ky \times Iz \qquad (22)$$

In this way, the other component force fyz is proportional to the Z-directional command value Iz and ω, i.e., the time derivative of the stage position. As in the previous case, the stage positioning characteristics may be degraded due to the other component force fyz. Accordingly, the method for controlling a linear motor of the present invention is characterized in that the second electrical angle calculator 16 calculates the second electrical angle (ψ) 25. Details of the calculation method will be described below.

First, the electrical angle adder 17 executes computation for calculating the electrical angle (θ) 26 as the sum of the first electrical angle (φ) 24 and the second electrical angle (ψ) 25.

$$\theta = \phi + \psi \qquad (23)$$

Here, the commutation calculator 18 executes computation using the electrical angle (θ) 26 in the formula (23). Note that the first electrical angle (φ) 24 is expressed in the formula (3) and the argument of a trigonometric function is the first electrical angle (φ) 24 in the formulae (1), (2), (13), and (14). In light of the above, the formulae (4) and (5) are represented by the following formulae, respectively:

$$\begin{aligned} Ya &= Iy \times \cos\theta \\ &= Iy \times \cos(\varphi + \psi) \\ &= Iy \times (\cos\varphi \times \cos\psi - \sin\varphi \times \sin\psi) \end{aligned} \qquad (24)$$

$$\begin{aligned} Yb &= -Iy \times \sin\theta \\ &= -Iy \times \sin(\varphi + \psi) \\ &= -Iy \times (\sin\varphi \times \cos\psi + \cos\varphi \times \sin\psi) \end{aligned} \qquad (25)$$

Furthermore, considering an error current caused by the current driver characteristics, the currents actually flowing through the coil Yae and Ybe are represented by the following formulae, respectively:

$$\begin{aligned} Yae &= Iy(\cos\varphi \times \cos\psi - \sin\varphi \times \sin\psi) - \\ &\quad \alpha(Iy(\cos\varphi \times \cos\psi - \sin\varphi \times \sin\psi))' \\ &= Iy(\cos\varphi \times \cos\psi - \sin\varphi \times \sin\psi) - \\ &\quad \alpha Iy'(\cos\varphi \times \cos\psi - \sin\varphi \times \sin\psi) - \\ &\quad \alpha Iy \begin{pmatrix} -\omega\sin\varphi \times \cos\psi - \xi\cos\varphi \times \sin\psi - \\ \omega\cos\varphi \times \sin\psi - \xi\sin\varphi \times \cos\psi \end{pmatrix} \end{aligned} \qquad (26)$$

$$\begin{aligned} Ybe &= -Iy(\sin\varphi \times \cos\psi + \cos\varphi \times \sin\psi) - \\ &\quad \alpha(-Iy(\sin\varphi \times \cos\psi + \cos\varphi \times \sin\psi))' \\ &= -Iy(\sin\varphi \times \cos\psi + \cos\varphi \times \sin\psi) + \\ &\quad \alpha Iy'(\sin\varphi \times \cos\psi + \cos\varphi \times \sin\psi) + \\ &\quad \alpha Iy \begin{pmatrix} \omega\cos\varphi \times \cos\psi - \xi\sin\varphi \times \sin\psi - \\ \omega\sin\varphi \times \sin\psi + \xi\cos\varphi \times \cos\psi \end{pmatrix} \end{aligned} \qquad (27)$$

where ω=dφ/dt and ξ=dψ/dt.

The Y-directional thrust force fy generated by the currents Yae and Ybe is represented by the following formula using the formulae (1), (2), (26), and (27).

$$fy = Ky \times Iy \times \cos\psi - \alpha Ky \times Iy' \cos\psi + \alpha\xi Iy \times \sin\psi + \alpha\omega Iy \times \sin\psi \qquad (28)$$

Likewise, the other Z-directional component force fzy generated by the currents Yae and Ybe is represented by the following formula using the formulae (13), (14), (26), and (27).

$$fzy = Kz(-Iy \times \sin \psi + \alpha Iy' \sin \psi + \alpha \omega Iy \times \cos \psi + \alpha \xi Iy \times \cos \psi) \quad (29)$$

Here, since the values of ψ, α, and ξ are very small, sin ψ=ψ, cos ψ=1.0, and the product of φ, α, and ξ is approximated as zero. Hence, the formulae (28) and (29) are represented by the following formulae, respectively:

$$fy = Ky \times Iy - \alpha Ky \times Iy' \quad (30)$$

$$fzy = Kz \times Iy(-\psi + \alpha\omega) \quad (31)$$

Furthermore, assuming ψ=αω (32), the other Z-directional component force fzy obtained from the Y-directional command value Iy in the formula (31) becomes zero. In other words, the second electrical angle (ψ) 25 is proportional to ω, and is the derivative value with respect to the time for the stage position. The coil position is assumed to be immobile, the time variation for the stage position is the derivative value with respect to the time for the relative position between the coil and the magnet. Since the time variation is, in fact, affected by the previous approximation condition, strictly speaking, it does not become zero. However, it can become sufficiently small for practical application. Furthermore, the formula (30) is represented by the following formula according to the feed forward correction in the formula (9)'.

$$fy = Ky \times Iy \quad (30)'$$

Hence, the Y-directional thrust force fy becomes a desired value.

Likewise, the commutation calculator 18 executes computation on the Z-directional command value Iz using the electrical angle (θ) 26. Here, the Z directional thrust force fz and the other Y-directional component force fyz obtained from the command value Iz are represented by the following formulae, respectively:

$$fz = Kz \times Iz - \alpha Kz \times Iz' \quad (33)$$

$$fyz = -Ky \times Iz(-\psi + \alpha\omega) \quad (34)$$

Here, if the formula (32) is used, the other Y-directional component force fyz is zero. Again, while it is not zero to be accurate, it can be sufficiently small in practical application. Also, since Iz' is approximately zero as described above, the formula (33) is represented by the following formula:

$$fz = Kz \times Iz \quad (33)'$$

Hence, the Z directional thrust force fz becomes a desired value. In this way, the second electrical angle (ψ) 25 can be computed based on the derivative value with respect to the time for the relative position between the coil and the magnet.

Figure 3:
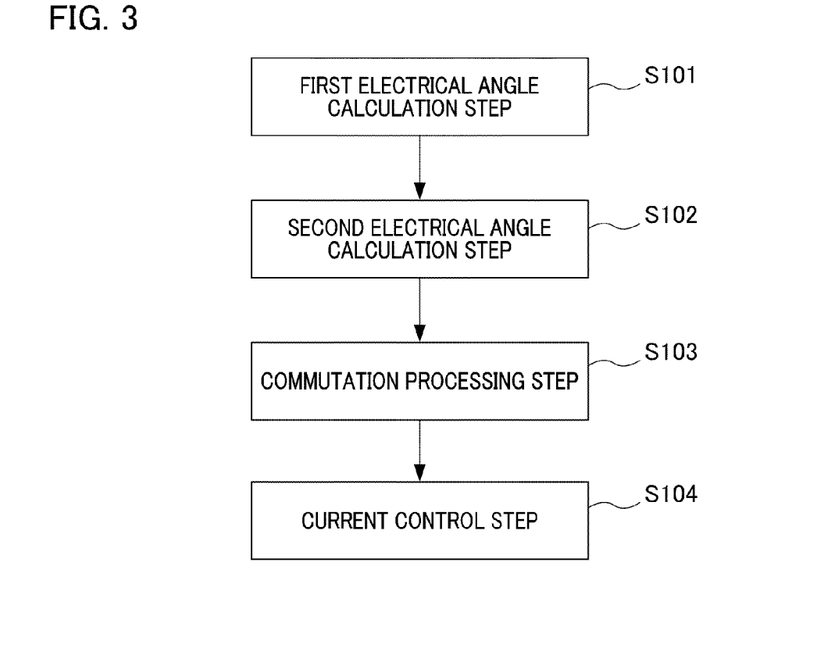
FIG. 3 is a flowchart illustrating the flow of control according to the first embodiment of the present invention.

Next, a description will be given to the flow of control processing for the linear motor to be executed by the control apparatus 7. FIG. 3 is a flowchart illustrating the flow of control of the linear motor according to the present embodiment. First, as a first electrical angle calculation step, the first electrical angle calculator 15 calculates the first electrical angle (φ) 24 using the formula (3) (step S101). As described above, depending on the reference of the Y-directional displacement y of the stage, it is not necessary that φ=0 when y=0. In such a case, an initial offset φ0 may be added to φ.

Next, the second electrical angle calculator 16 calculates the second electrical angle (ψ) 25 using the formula (32) as a second electrical angle calculation step (step S102). Here, since ω is dφ/dt, ω is proportional to the time derivative for the position of the stage according to the formula (3). Note that the coefficient α is determined as follows. Specifically, first, the control apparatus 7 brings the stage 2 in a non-servo state to fix it at a certain position. Next, the current driver 9 inputs sinusoidal command current to the coil of the coil group 4, and the control apparatus 7 measures a response of the current flowing through the coil at that time. In this way, the coefficient α can be determined from the frequency characteristics obtained from the input/output relationship that has been measured by varying the frequency of the sinusoidal wave. It is desirable that the α data be stored in the storage section (not shown) previously provided in the control apparatus 7, and be called up for use upon computation by the second electrical angle calculator 16.

Next, the electrical angle adder 17 and the commutation calculator 18 calculate the sum of the first electrical angle (φ) 24 and the second electrical angle (ψ) 25 using the formula (23) to calculate the electrical angle (θ) 26 as a commutation processing step (step S103). Furthermore, the electrical angle adder 17 and the commutation calculator 18 apply the electrical angle (θ) 26 to the argument of the trigonometric function, as appropriate, and execute computation of commutation processing with respect to the command current so as to generate a command for the current driver 9. Then, the current driver 9 controls the current flowing through the coil based on the command as a current controlling step (step S104).

As explained in the foregoing, according to the present invention, a command includes a sinusoidal wave component, which has an amplitude proportional to a thrust force command value and is 90 degrees out of phase with the sinusoidal wave, whereby the force acting in a direction different from the direction to be driven, which occurs due to the delay of the current flowing through the coil, can be reduced.

Second Embodiment

Figure 4:
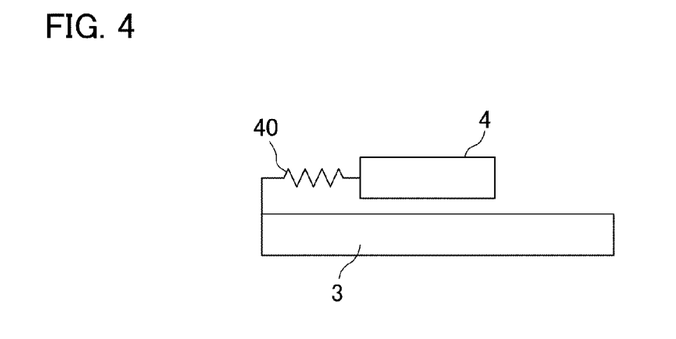
FIG. 4 is a schematic diagram illustrating a stator unit according to a second embodiment of the present invention.

The second electrical angle (ψ) 25 is proportional to the time derivative for the position of the stage 2 according to the formula (32) of the first embodiment, whereas the second embodiment of the present invention is characterized in that the second electrical angle (ψ) 25 is proportional to a second derivative value. FIG. 4 is a schematic diagram illustrating the base member 3, which is the reference for the stator unit, and the coil (coil group 4) to the base member 3. In general, when the coil is fixed to the base member 3, the coil is preferably rigidly fixed thereto. However, a typical coil is a copper coil winding impregnated with a resin and hence has a small rigidity compared to that of a metal material. Also, rigid fixing may not be attained in order to suppress thermal expansion caused by the Joule heat of the coil. Accordingly, in the present embodiment, as shown in FIG. 4, the coil is fixed to the base member 3 via an elastic member 40. In this case, it is preferable that, although it is not limited thereto, the elastic member 40 be a spring.

Here, when a drive reaction force acts on the coil, the coil position is changed with respect to the base member 3, whereby an error occurs in the relative distance between the coil and the magnet. Consequently, an error occurs in the calculated value of the second electrical angle (ψ) 25, resulting in a degradation in accuracy of the offsetting of the other component force. In contrast, a sensor for detecting a coil position may be provided in a stator unit, but cost is increased. Hence, focusing on the fact that the natural frequency, which is defined by the rigidity of the elastic member 40 disposed between the base member 3 and the coil group 4 and the mass of the coil body; is relatively high, and its frequency is much lower than the natural frequency in a normal driving, displacement of the coil is approximated as being proportional to the drive reaction force. In this case, the drive reaction force is proportional to the acceleration of the stage 2, the value of the second electrical angle (ψ) 25 is calculated using the following formula based on the acceleration information of the stage 2:

$$\psi = \alpha\omega + \gamma d^2 y/dt^2 \quad (35)$$

Note that the gain γ, i.e., the correction value may be calculated from the design value of the elastic member 40, the measurement value of the natural frequency of the coil, and the like, or may be adjusted by actually performing acceleration/deceleration driving of the stage 2 such that other component force becomes small. As explained in the foregoing, according to the linear motor control method of the present embodiment, more accurate control than that of the first embodiment may be achieved.

Third Embodiment

Figure 5:
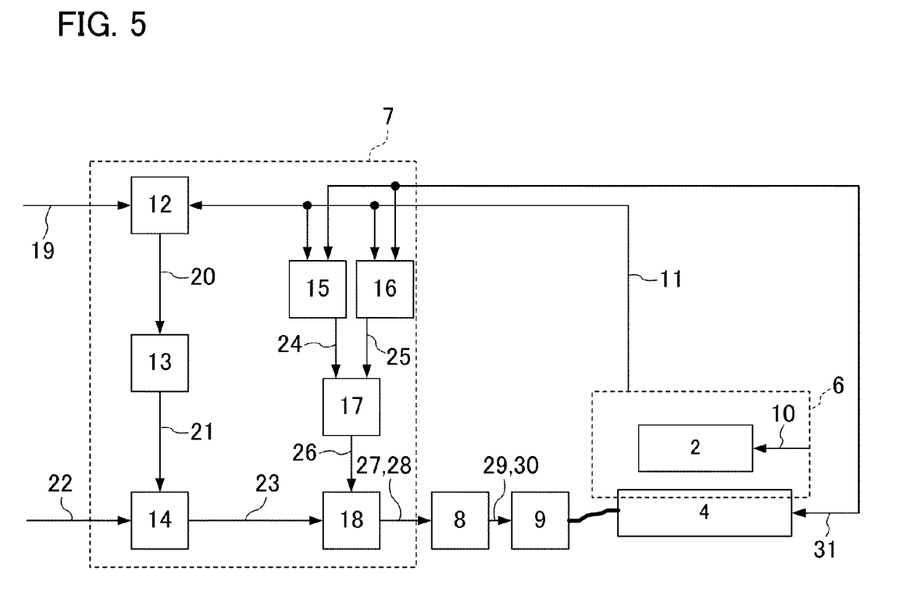
FIG. 5 is a block diagram illustrating a linear motor control system according to a third embodiment of the present invention.

FIG. 5 is a block diagram illustrating a linear motor control system according to a third embodiment of the present invention. In FIG. 5, the same elements as those shown in FIG. 2 are designated by the same reference numerals and explanation thereof will be omitted. The stage device according to the present embodiment is characterized in that the base member 3 is freely movably supported in the driving direction of the stage 2, and the stator unit moves in the direction opposite to the direction of the stage 2 in response to the drive reaction force of the stage 2. The stage configuration has an advantage in that the vibration of the overall stage device is suppressed because the drive reaction force is not transmitted to the reference material that supports the stator unit and the stage 2.

In this case, since the stator unit moves, it is also required that the position of the stator unit is measured in order to obtain the relative distance between the coil and the magnet. Hence, for the computation of the first electrical angle (φ) 24, the position measurement value (y) 11, and the measurement value (yk) 31 measured for the stator unit are newly employed. For the position measurement of the base member 3, the aforementioned laser interferometer system, which provides quick response and allows for highly accurate measurement, is employed. For the position measurement of the base member 3, although a cost becomes greater if the laser interferometer system is employed, the responsiveness may be degraded if a low-cost position measuring sensor is used instead. Here, since a position detection error caused by the response characteristics of the sensor can be substantially approximated as a primary delay system, the position detection error is substantially proportional to the speed of the base member 3. Specifically, the base member 3 and the stage 2 have mutually opposite-directed velocities in inverse proportion to the mass thereof, whereby the velocities of the base member 3 and the stage 2 are proportional to each other. Hence, when the position measuring sensor is employed, the delay caused by the position measuring sensor may be compensated based on the speed information of the stage 2. In this case, the value of the second electrical angle (ψ) 19 is calculated using the following formula:

$$\psi = \alpha\omega + \gamma dy/dt \quad (36)$$

Here, the gain γ may be calculated from the frequency response value of the position measuring sensor of the base member 3. Alternatively, the gain γ may be adjusted such that the component force for actually performing the acceleration/deceleration driving of the stage 2 becomes small.

Fourth Embodiment

Figure 6:
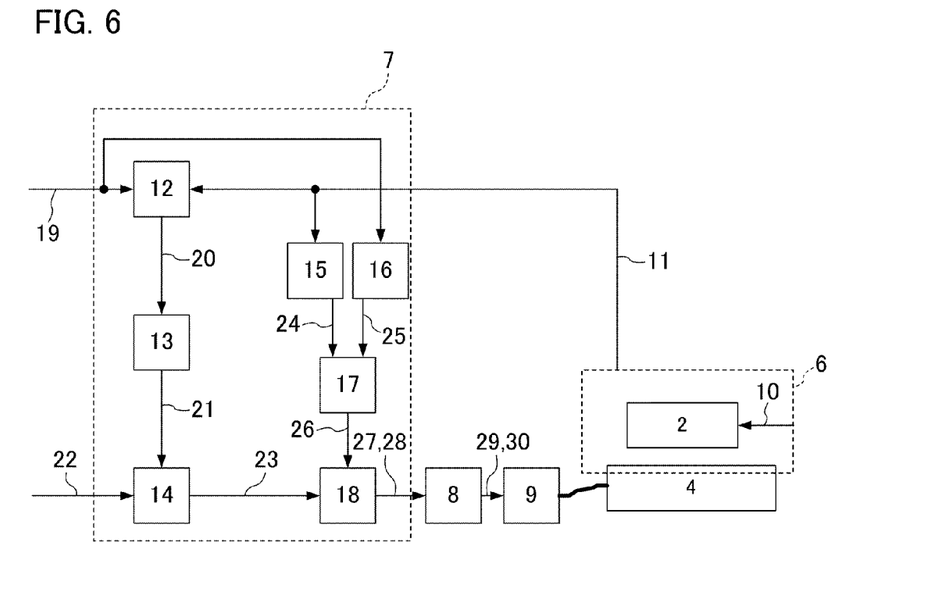
FIG. 6 is a block diagram illustrating a linear motor control system according to a fourth embodiment of the present invention.

FIG. 6 is a block diagram illustrating a linear motor control system according to a fourth embodiment of the present invention. In FIG. 6, the same elements as those shown in FIG. 2 are designated by the same reference numerals and explanation thereof will be omitted. While in the first embodiment, the speed information and the acceleration information of the stage 2 is calculated based on the position measurement value of the stage 2, the stage device according to the present embodiment is characterized in that such information is calculated using the stage Y-directional position command (d) 19. This is based on the fact that the speed and acceleration of the stage 2 are assumed to substantially coincide with the command value if the stage 2 is positioned with high accuracy. The linear motor control method of the present embodiment provides the same effects as those in the first embodiment.

Fifth Embodiment

Figure 7:
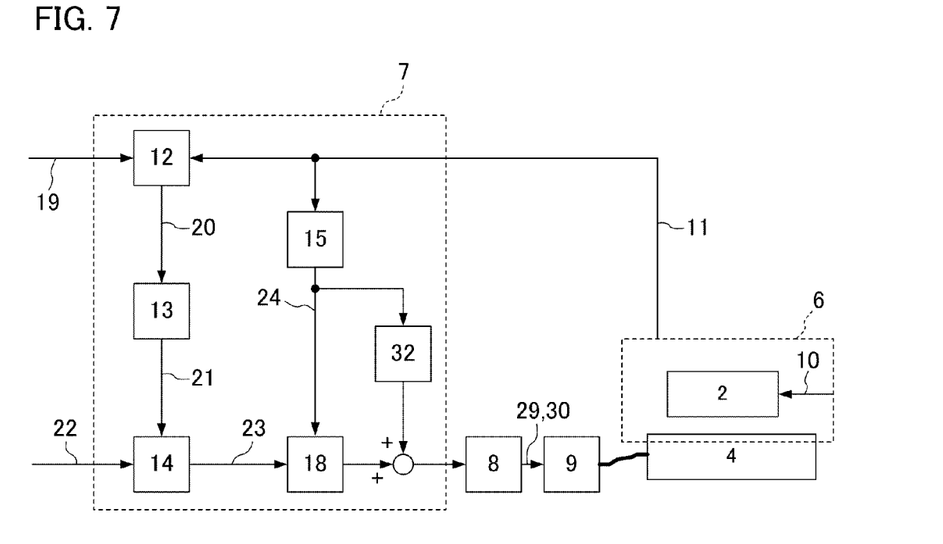
FIG. 7 is a block diagram illustrating a linear motor control system according to a fifth embodiment of the present invention.

FIG. 7 is a block diagram illustrating a linear motor control system according to a fifth embodiment of the present invention. In FIG. 7, the same elements as those shown in FIG. 2 are designated by the same reference numerals and explanation thereof will be omitted. The stage device according to the present embodiment is characterized in that a correction command current calculator 32 is newly employed in the control apparatus 7. As described above, the actually flowing currents Yae and Ybe with respect to the command currents given by the formulae (4) and (5) are represented by the formulae (10) and (11), respectively. In contrast, in the correction command current calculator 32, the correction command currents shown in the following formulae are added with respect to the command current.

$$Yac = -\alpha Iy \times \omega \sin\theta \quad (37)$$

$$Ybc = -\alpha Iy \times \omega \cos\theta \quad (38)$$

In other words, the correction command current in the formula (37) is 90 degrees out of phase with the sinusoidal wave phase with respect to the formula (4). Likewise, the correction command current in the formula (38) is also 90 degrees out of phase with the sinusoidal wave phase with respect to the formula (5). Furthermore, multiplying ω means multiplying the gain proportional to the time variation for the relative position between the coil and the magnet as described above. Hence, the correction command current is added to the command current so as to generate a command for the current driver 9.

In this case, the currents actually flowing through the coil Yae and Ybe are represented by the following formulae, respectively. Here, θ is a value that has been calculated by the first electrical angle calculator 15.

$$\begin{aligned}Yae &= Iy \times \cos\theta - \alpha Iy \times \omega\sin\theta - \\ &\quad \alpha(Iy \times \cos\theta - \alpha Iy \times \omega\sin\theta)' \\ &= Iy \times \cos\theta - \alpha Iy'\cos\theta + \alpha^2 Iy \times \omega^2\cos\theta\end{aligned} \quad (39)$$

$$\begin{aligned}Ybe &= -Iy \times \sin\theta - \alpha Iy \times \omega\sin\theta - \\ &\quad \alpha(Iy \times \sin\theta - \alpha Iy \times \omega\cos\theta)' \\ &= -Iy \times \sin\theta + \alpha Iy'\sin\theta - \alpha^2 Iy \times \omega^2\sin\theta\end{aligned} \quad (40)$$

As described above, if the value α is very small, the term of $\alpha^2$ is substantially negligible. Thus, the third terms of the formulae (39) and (40) can be approximated by zero. By performing feed forward correction of the formula (9)', the second terms of the formulae (39) and (40) can also be approximated by zero. In other words, the formulae (39) and (40) are approximated by the following formulae (39)' and (40)', respectively:

$$Yae = Iy \times \cos\theta \quad (39)'$$

$$Ybe = -Iy \times \sin\theta \quad (40)'$$

Furthermore, the Y-directional thrust force is represented by the following formula using the formulae (1) and (2) and the formulae (39)' and (40)', and becomes a desired value proportional to Iy.

$$fy = Iy \times \cos^2\theta + Iy + \sin^2\theta \quad (41)$$
$$= Ky \times Iy$$

Likewise, the other Z-directional component force fzy is represented by the following formula using the formulae (13) and (14) and the formulae (39)' and (40)'.

$$fzy = Iy \times \cos\theta \times \sin\theta - Iy \times \sin\theta \times \cos\theta \quad (42)$$
$$= 0$$

As explained in the foregoing, according to the present embodiment, using the formula (9)' for feed forward correction, the formula (37) for correction command current, and the formula (38) for correction command current, the Y-directional thrust force becomes a desired value proportional to Iy, whereby the Z-directional other component can be suppressed.

(Exposure Apparatus)

Figure 8:
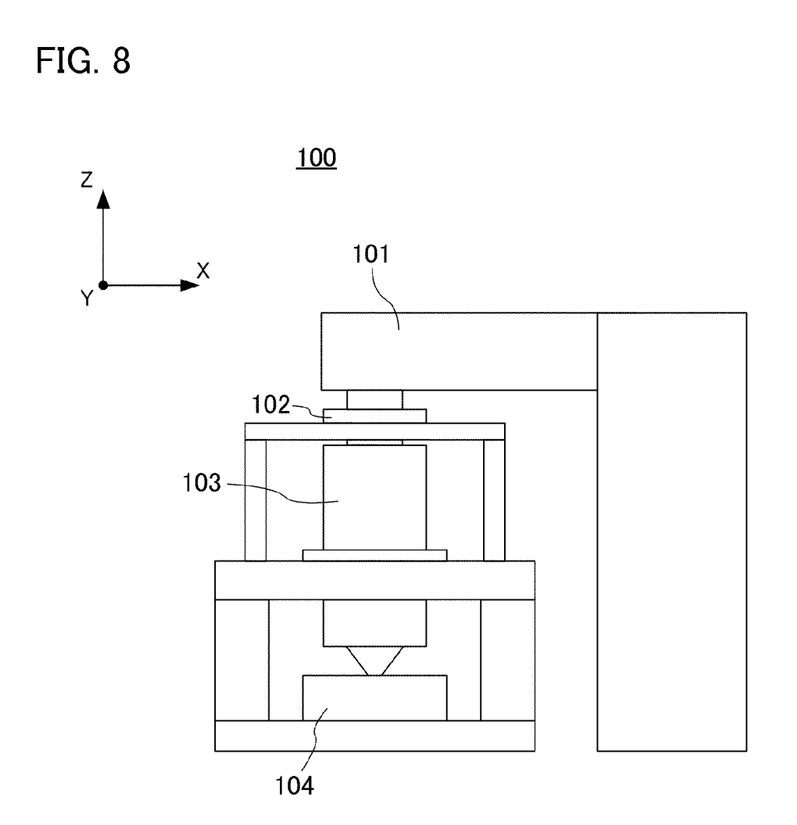
FIG. 8 is a schematic diagram illustrating the configuration of an exposure apparatus according to an embodiment of the present invention.

FIG. 8 is a schematic diagram illustrating the configuration of an exposure apparatus to which the stage device of the present invention is applied. The exposure apparatus 100 is used in the manufacture of a semiconductor device such as a semiconductor integrated circuit and a device, such as a micro-machine and a thin-film magnetic head, on which a fine pattern is formed. Exposure light emitted from an illumination optical system 101 is illuminated onto a wafer, i.e., a substrate to be treated through an original (reticle) mounted on an original stage 102 and through a projection optical system 103 so as to form a desired pattern on the wafer mounted on the substrate stage 104. The stage device of the present invention described above may be employed as the original stage 102 or the substrate stage 104.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

Other Embodiments

In the aforementioned embodiments, the block diagram of the control apparatus 7 is a conceptual illustration for the purpose of explanation. Since the control apparatus 7 is configured as a digital system, sequence of multiplication, addition, and the like may be interchanged depending on the description means for software. However, as long as computation is based on the formulae (1) to (42), there is no essential difference.

While in the aforementioned embodiments, a description has been made using the two-phase linear motor, the present invention may also be applied to the configuration of the three or more phase linear motor. Furthermore, although the linear motor has been illustrated in the planar linear motor configuration in which a magnet is disposed on only one side of the coil, other configurations are also contemplated. For example, the coils may be disposed on both sides of a movable magnet, or may be centrally disposed, and both sides of the coils are provided with the movable magnets.

Figure 9:
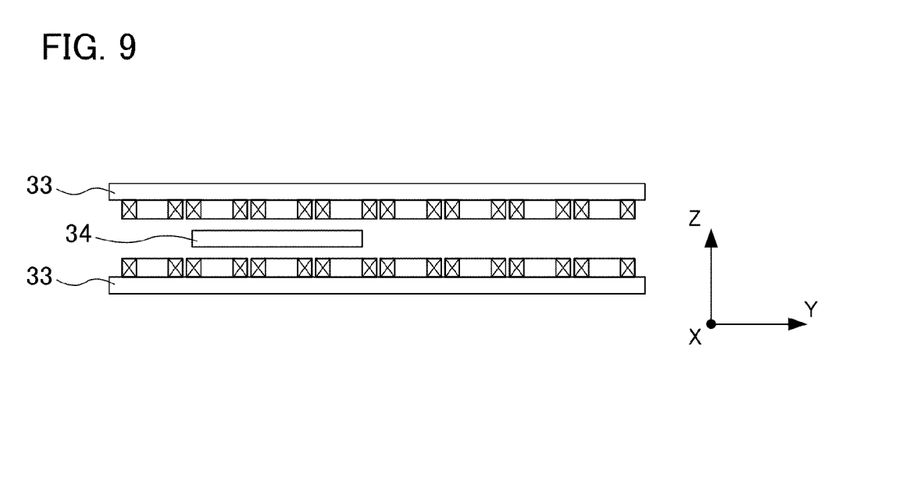
FIG. 9 is a schematic diagram illustrating the configuration of a linear motor according to another embodiment of the present invention.

FIG. 9 is a schematic diagram illustrating the configuration of a linear motor having the coils disposed on both sides of a movable magnet. A stator unit 33 is provided at regular intervals in the Y direction, and includes the coils that are disposed on the upper and lower sides facing each other. Furthermore, the stator unit 33 includes a movable unit 34, which is approximately centrally disposed between the coils and magnetized in the Z direction, in which a main pole magnet having a different magnetic pole is periodically arranged at regular intervals. The movable unit 34 is connected to a stage unit (not shown). The stage unit is guided so as to freely move only in the Y direction using a static pressure guide and the like, and the movement of the stage unit in the other axes such as the Z-axial direction is regulated by the rigidity of the guide. In such a stage, it is an ideal that only the Y-directional force is obtained from the linear motor. Other component forces in a direction other than the Y direction, such as the Z direction, may cause change in the positioning of the stage. The present invention may also be applied to the linear motor having the configuration described above, and provides effects for suppressing the change of the attitude of the stage.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-138699 filed Jun. 9, 2009 which is hereby incorporated by reference herein in its entirety.

What is claimed is:
1. A stage device comprising:
a linear motor having a coil and a plurality of permanent magnets;
a current driver that supplies current to the coil; and
a control section that generates a command for the current driver, wherein the control section generates the command through commutation processing in which a sinusoidal wave using an electrical angle obtained by calculation based on the relative position between the coil and the permanent magnet is multiplied by a thrust force command value for the linear motor, and further ensures that a sinusoidal wave component, which has an amplitude proportional to a thrust force command value and is 90 degrees out of phase with the sinusoidal wave, is included in the command.

2. The stage device according to claim 1, wherein the control section adds a value, at which a gain proportional to the time variation of the relative position and a sinusoidal wave that is 90 degrees out of phase with the sinusoidal wave are multiplied with the thrust force command value, to the command.

3. The stage device according to claim 1, wherein the control section comprises a first electrical angle calculator for calculating a first electrical angle based on the relative position between the coil and the permanent magnet, and a second electrical angle calculator for calculating a second electrical angle based on the derivative value with respect to the time for the relative position, and generates the command based on an electrical angle obtained by adding the first electrical angle and the second electrical angle.

4. The stage device according to claim 3, wherein the second electrical angle calculator calculates the second electrical angle based on the derivative value with respect to the time for the relative position and a second-order derivative value.

5. The stage device according to claim 3, wherein the second electrical angle calculator calculates the second electrical angle by multiplying the derivative value with respect to the time for the relative position by a coefficient which is pre-stored in a storage section.

6. The stage device according to claim 3, further comprising:
a sensor that detects the relative position between the coil and the permanent magnet,
wherein the first electrical angle calculator and second electrical angle calculator carry out a computation based on the output of the sensor.

7. A stage device comprising:
a linear motor having a coil and a plurality of permanent magnets;
a current driver that supplies current to the coil; and
a control section that generates a command for the current driver,
wherein the control section generates the command by multiplying a sinusoidal wave using an electrical angle, which is obtained by adding a first electrical angle obtained based on the relative position between the coil and the permanent magnet and a second electrical angle obtained based on the derivative value with respect to the time for the first electrical angle, by a thrust force command value for the linear motor.

8. A method for controlling a stage device that comprises a linear motor having a coil and a plurality of permanent magnets and a current driver that supplies current to the coil, and generates a command for the current driver, the method comprising:
a first electrical angle computation step of calculating a first electrical angle based on the relative position between the coil and the permanent magnet;
a second electrical angle computation step of calculating a second electrical angle based on the derivative value with respect to the time for the relative position;
a commutation processing step of generating a command for the current driver based on an electrical angle obtained by adding the first electrical angle and the second electrical angle; and
a current controlling step of controlling current flowing through the coil based on the command.

9. An exposure apparatus that projects a pattern of an original onto a substrate for exposure, the exposure apparatus comprising:
a stage device that holds the original or the substrate,
wherein the stage device comprises:
a linear motor having a coil and a plurality of permanent magnets;
a current driver that supplies current to the coil; and
a control section that generates a command for the current driver,
wherein the control section generates the command through commutation processing in which a sinusoidal wave using an electrical angle obtained by calculation based on the relative position between the coil and the permanent magnet is multiplied by a thrust force command value for the linear motor, and further ensures that a sinusoidal wave component, which has an amplitude proportional to a thrust force command value and is 90 degrees out of phase with the sinusoidal wave, is included in the command.

10. An exposure apparatus that projects a pattern of an original onto a substrate for exposure, the exposure apparatus comprising:
a stage device that holds the original or the substrate,
wherein the stage device comprises:
a linear motor having a coil and a plurality of permanent magnets;
a current driver that supplies current to the coil; and
a control section that generates a command for the current driver,
wherein the control section generates the command by multiplying a sinusoidal wave using an electrical angle, which is obtained by adding a first electrical angle obtained based on the relative position between the coil and the permanent magnet and a second electrical angle obtained based on the derivative value with respect to the time for the first electrical angle, by a thrust force command value for the linear motor.

11. A device manufacturing method comprising the steps of:
exposing a pattern onto a substrate using an exposure apparatus including a stage device that holds the original or the substrate, wherein the stage device comprises:
a linear motor having a coil and a plurality of permanent magnets;
a current driver that supplies current to the coil; and
a control section that generates a command for the current driver,
wherein the control section generates the command through commutation processing in which a sinusoidal wave using an electrical angle obtained by calculation based on the relative position between the coil and the permanent magnet is multiplied by a thrust force command value for the linear motor, and further ensures that a sinusoidal wave component, which has an amplitude proportional to a thrust force command value and is 90 degrees out of phase with the sinusoidal wave, is included in the command, and
developing the exposed substrate.

12. A device manufacturing method comprising the steps of:

exposing a pattern onto a substrate using an exposure apparatus including a stage device that holds the original or the substrate, wherein the stage device comprises:

a linear motor having a coil and a plurality of permanent magnets;

a current driver that supplies current to the coil; and a control section that generates a command for the current driver, wherein the control section generates the command by multiplying a sinusoidal wave using an electrical angle, which is obtained by adding a first electrical angle obtained based on the relative position between the coil and the permanent magnet and a second electrical angle obtained based on the derivative value with respect to the time for the first electrical angle, by a thrust force command value for the linear motor, and developing the exposed substrate.

* * * * *